United States Patent
Chae et al.

(10) Patent No.: US 7,387,971 B2
(45) Date of Patent: Jun. 17, 2008

(54) FABRICATING METHOD FOR FLAT PANEL DISPLAY DEVICE

(75) Inventors: Gee Sung Chae, Incheon (KR); Mi Kyung Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 435 days.

(21) Appl. No.: 11/260,393

(22) Filed: Oct. 28, 2005

(65) Prior Publication Data

US 2006/0286699 A1 Dec. 21, 2006

(30) Foreign Application Priority Data

Jun. 17, 2005 (KR) .................... 10-2005-0052666

(51) Int. Cl.
*H01L 21/31* (2006.01)
*H01L 21/469* (2006.01)

(52) U.S. Cl. .................... 438/759; 438/82; 438/99; 438/161; 438/623; 438/780; 438/781; 438/789; 438/790; 438/793; 438/794; 257/E21.238; 257/E21.255; 257/E21.582

(58) Field of Classification Search .......... 257/E21.255, 257/E21.582, E21.238; 438/161, 623, 759, 438/780, 781, 789, 790, 793, 794, 82, 99
See application file for complete search history.

(56) References Cited

U.S. PATENT DOCUMENTS

| | | | | |
|---|---|---|---|---|
| 3,472,676 A | * | 10/1969 | Maria et al. ............... | 430/118.3 |
| 5,512,328 A | * | 4/1996 | Yoshimura et al. .......... | 427/498 |
| 5,599,648 A | * | 2/1997 | Kondo et al. ................ | 430/256 |
| 6,027,630 A | * | 2/2000 | Cohen ........................ | 205/135 |
| 6,436,591 B1 | * | 8/2002 | Ohtsu et al. .................... | 430/7 |
| 7,098,061 B2 | * | 8/2006 | Sirringhaus et al. ........... | 438/30 |
| 2003/0068581 A1 | * | 4/2003 | Kawamura et al. .......... | 430/315 |
| 2003/0134100 A1 | * | 7/2003 | Mao et al. ................ | 428/304.4 |
| 2004/0009303 A1 | * | 1/2004 | Ito et al. ...................... | 427/421 |
| 2004/0224321 A1 | * | 11/2004 | Nicolau et al. ................. | 435/6 |
| 2004/0251171 A1 | * | 12/2004 | Iida et al. ........................ | 209/1 |
| 2005/0202348 A1 | * | 9/2005 | Nakayama et al. .......... | 430/311 |
| 2005/0252398 A1 | * | 11/2005 | Ohkura et al. .............. | 101/368 |
| 2005/0274986 A1 | * | 12/2005 | Sirringhaus et al. ......... | 257/213 |
| 2005/0282402 A1 | * | 12/2005 | Kim .......................... | 438/780 |
| 2006/0159838 A1 | * | 7/2006 | Kowalski et al. .............. | 427/58 |
| 2008/0008822 A1 | * | 1/2008 | Kowalski et al. .............. | 427/58 |

* cited by examiner

*Primary Examiner*—Matthew S. Smith
*Assistant Examiner*—Jarrett J Stark
(74) *Attorney, Agent, or Firm*—Morgan Lewis & Bockius LLP (57) ABSTRACT

A fabricating method for a flat panel display device having a thin film pattern over a substrate is disclosed. The fabricating method includes depositing a hydrophilic resin over a substrate and patterning the hydrophilic resin to form hydrophilic resin patterns over areas outside where thin film patterns are to be formed over the substrate. The fabricating method also includes depositing a hydrophobic nano powder thin film material over the substrate and between the hydrophilic resin patterns and removing the hydrophilic resin patterns to form hydrophobic nano powder thin film patterns over the substrate. Moreover, the fabricating method includes treating the hydrophobic nano powder thin film patterns to form the thin film pattern.

16 Claims, 12 Drawing Sheets

FABRICATING METHOD FOR FLAT PANEL DISPLAY DEVICE

This application claims the benefit of the Korean Patent Application No. P2005-52666 filed on Jun. 17, 2005, which is hereby incorporated by reference.

BACKGROUND OF THE INVENTION

1. Field of the Invention

The present invention relates to a fabricating method for a flat panel display device, and more particularly to a fabricating method for a flat panel display device that is adapted to reduce its manufacturing cost.

2. Description of the Related Art

Generally, a liquid crystal display (LCD) device controls the light transmittance of liquid crystal in accordance with a video signal, thereby displaying a picture. For this, the liquid crystal display device includes a liquid crystal display panel where liquid crystal cells are arranged in a matrix shape, and a drive circuit for driving the liquid crystal display panel.

The liquid crystal display device is divided into two main classes in accordance with the direction of the electric field which drives the liquid crystal: a twisted nematic (TN) mode where a vertical electric field is used and an in-plane switch (IPS) mode where a horizontal electric field is used.

The TN mode is a mode in which the liquid crystal is driven by a vertical electric field between a pixel electrode and a common electrode respectively arranged on the lower and upper substrates. The TN mode device has an advantage in that its aperture ratio is relatively high but a disadvantage in that its viewing angle is relatively narrow. On the other hand, the IPS mode is a mode in which the liquid crystal is driven by a horizontal electric field between the pixel electrode and the common electrode arranged in parallel on the lower substrate. The IPS mode device has an advantage in that its viewing angle is relatively wide but a disadvantage in that its aperture ratio is relatively low.

Figure 1:
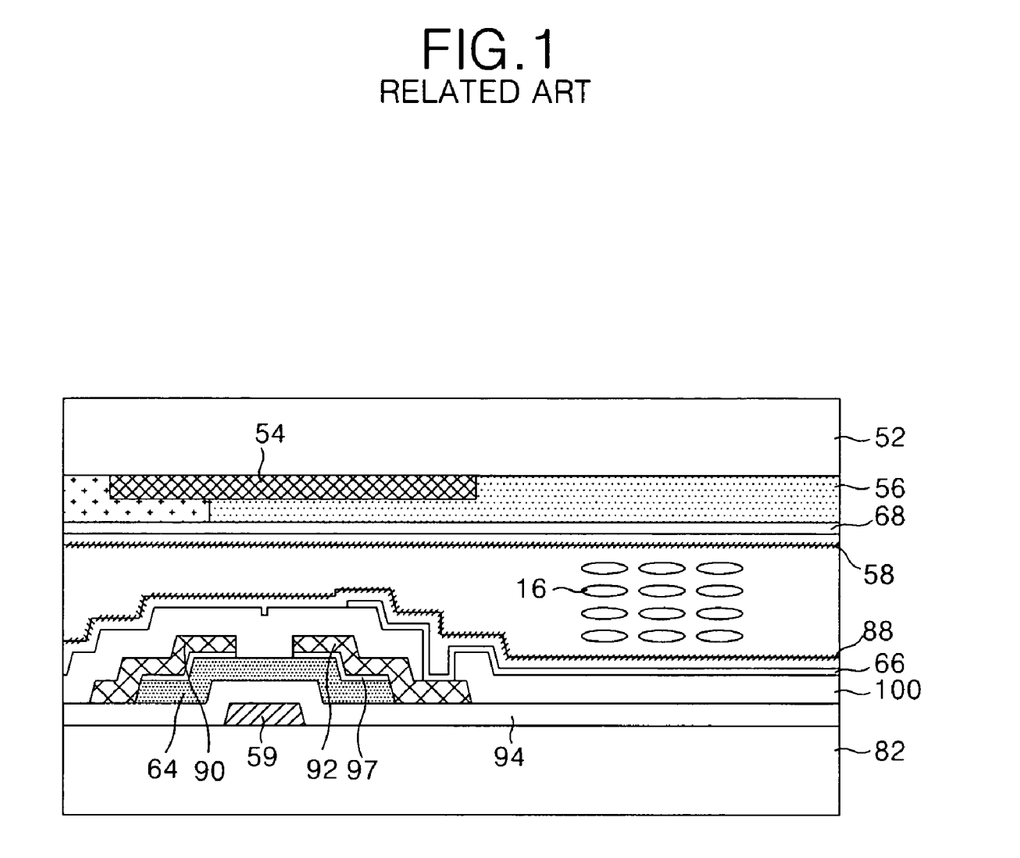
FIG. 1 is a sectional diagram representing a related art liquid crystal display panel.

FIG. 1 is a sectional diagram representing a TN mode liquid crystal display panel of the related art. In FIG. 1, the liquid crystal display panel includes an upper array substrate having black matrix 54, a color filter 56, a common electrode 68, and an upper alignment film 58 which are sequentially formed on an upper substrate 52. The panel also includes a lower array substrate having a thin film transistor (hereinafter, referred to as a "TFT"), a pixel electrode 66 and a lower alignment film 88 which are formed on a lower substrate 82. Liquid crystal 16 is injected into an inner space between the upper array substrate and the lower array substrate.

In the upper array substrate, the black matrix 54 defines a cell area where a color filter 56 is to be formed. The black matrix 54 prevents light leakage and absorbs external light to increase contrast. The color filter 56 is formed in the cell area which is defined by the black matrix 54. The color filter 56 is formed in R, G and B to realize a color picture of the liquid crystal display panel. A common voltage is supplied to the common electrode 68 to control the movement of the liquid crystal 16. In contrast to the TN mode in which the common electrode 68 is formed on the upper substrate 52 and the vertical electric field is used, in the IPS mode, the horizontal electric field is used, and the common electrode 68 is formed in the lower array substrate.

In the lower array substrate, the TFT includes a gate electrode 59 formed on the lower substrate 82 along with a gate line (not shown); semiconductor layers 64, 97 overlapping the gate electrode 59 with a gate insulating film 94 separating the semiconductor layers 64, 97 from the gate electrode 59; and source and drain electrodes 90, 92 formed over the semiconductor layers 64, 97 and spaced apart from each other. A data line (not shown) is formed along with the source/drain electrodes 90, 92. The TFT supplies a pixel signal from the data line to a pixel electrode 66 line in response to a scan signal from the gate line.

The pixel electrode 66 is formed over a passivation film 100 and is in contact with a drain electrode 92 of the TFT through a contact hole. The pixel electrode 66 is formed of a transparent conductive material with high light transmittance. The upper and lower alignment films 58, 88 for liquid crystal alignment are formed by a rubbing process after spreading an alignment material, such as polyimide, over the upper and lower substrates, respectively.

Thin film patterns, including the gate electrode 59, of the liquid crystal display panel are patterned by a photolithography process using a mask. FIGS. 2A to 2D are sectional diagrams representing the steps of forming a gate electrode using a photolithography process.

Figure 2A:
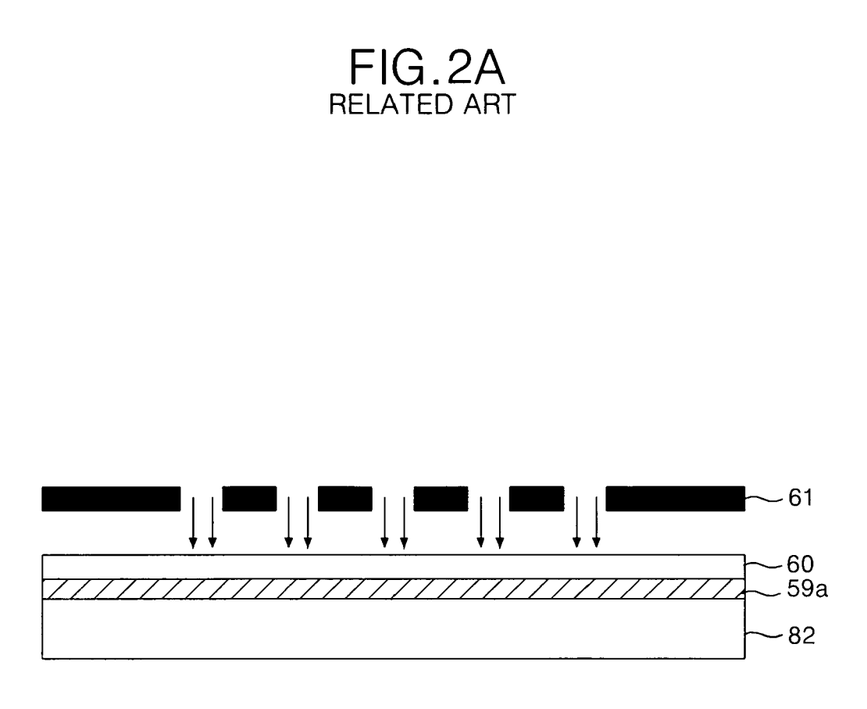
FIGS. 2A to 2D are sectional diagrams representing the steps of forming a gate electrode by use of a related art photolithography process.
Figure 2B:
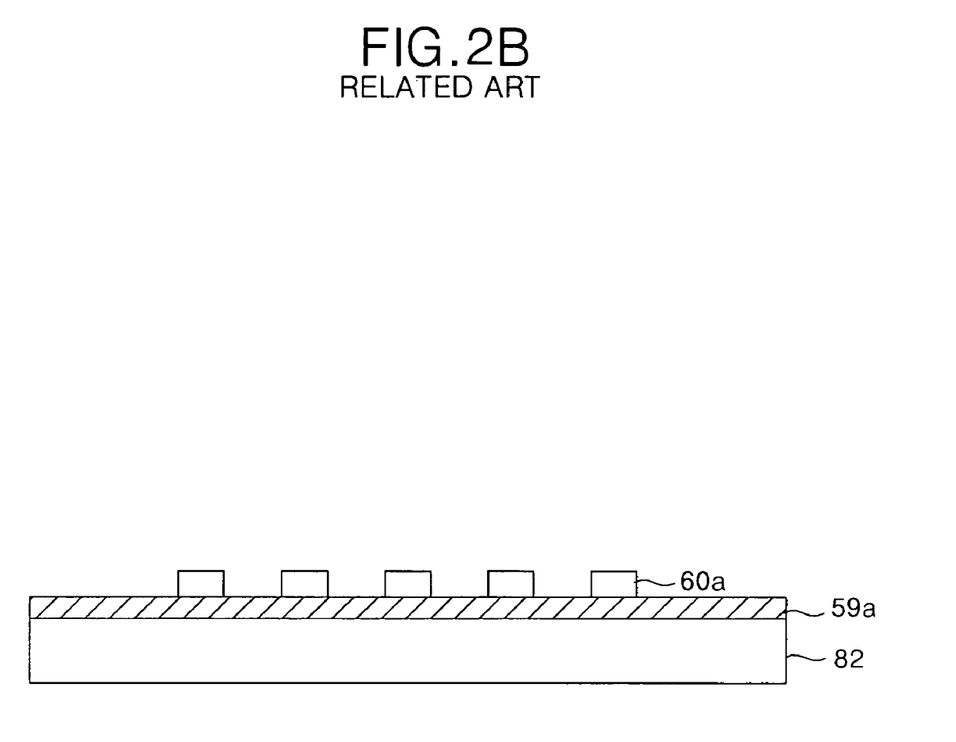
Figure 2C:
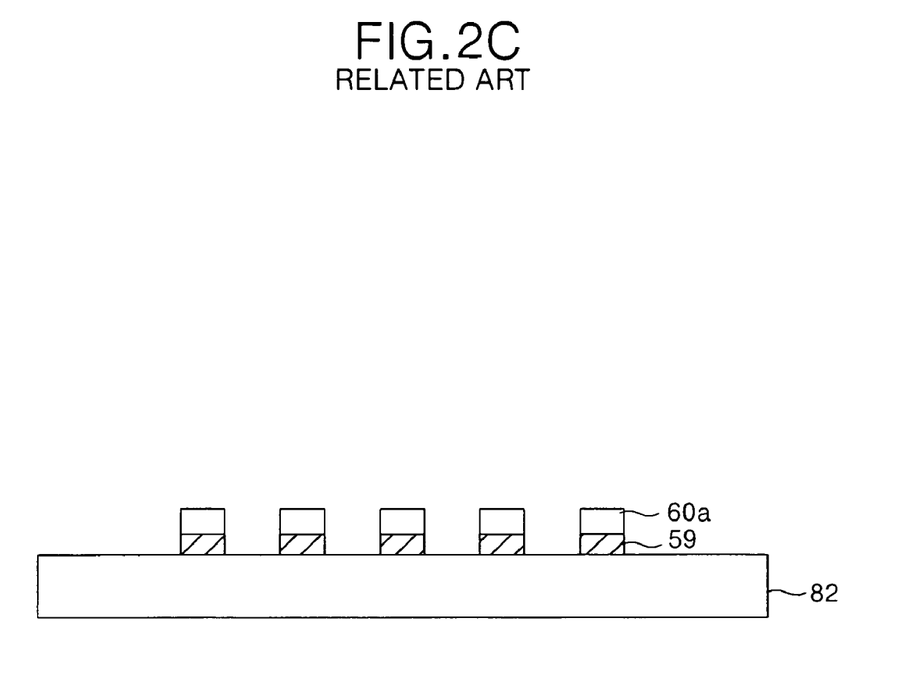
Figure 2D:
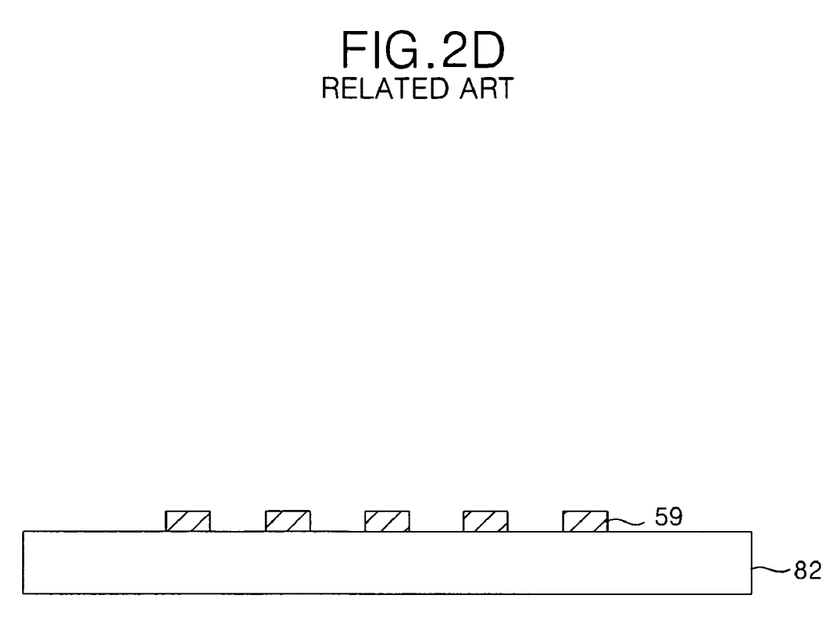

In FIG. 2A, a gate metal 59a and a photo-resist material 60 are deposited on a lower substrate 82 by a deposition method such as sputtering. A mask 61 with apertures aligned for each area where the gate electrode 59 is to be formed is placed on the photo-resist material 60. An exposure and development process is performed to form a photo-resist pattern 60a shown in FIG. 2B. An etching process is then performed to pattern the gate metal 59, as shown in FIG. 2C. Finally, as shown in FIG. 2D, the gate electrode 59 is completed with a stripping process to strip out the photo-resist pattern 60a.

The photolithography process of the related art using the mask includes at least a photo-resist spreading process, a mask aligning process, an exposure and development process and an etching process. Thus, the related art process is complicated. Also, a substantial amount of photo-resist material and developing solution may be wasted during the process for developing the photo-resist pattern. Moreover, expensive equipment is used in the exposure process of the related art photolithography process.

SUMMARY OF THE INVENTION

Accordingly, the present invention is directed to a fabricating method for a flat panel display device that substantially obviates one or more of the problems due to limitations and disadvantages of the related art.

Accordingly, it is an object of the present invention to provide a fabricating method for a flat panel display device that is adapted to reduce its manufacturing cost.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

In order to achieve these and other objects of the invention, a fabricating method for a flat panel display device having a thin film pattern over a substrate includes the steps of: depositing a hydrophilic resin over a substrate; patterning the hydrophilic resin to form hydrophilic resin patterns over areas outside where thin film patterns are to be formed over the substrate; depositing a hydrophobic nano powder thin film material over the substrate and between the hydrophilic resin patterns; removing the hydrophilic resin patterns to form hydrophobic nano powder thin film patterns over the substrate; and treating the hydrophobic nano powder thin film patterns to form the thin film pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. FIGS. 3A to 3G are sectional diagrams representing the steps of forming a gate electrode according to an exemplary embodiment of the present invention.

Figure 3A:
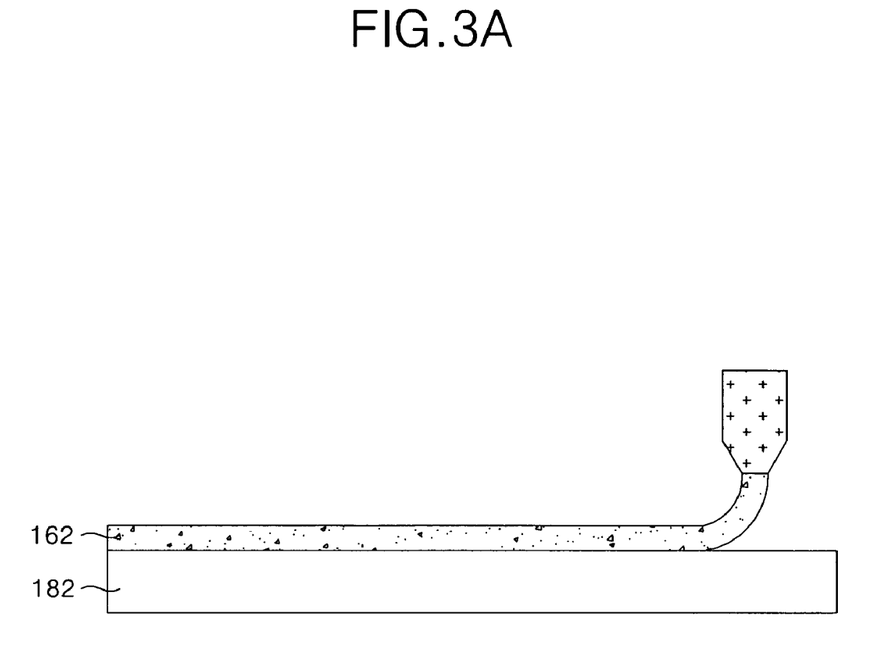
FIGS. 3A to 3G are sectional diagrams representing the steps of forming a gate electrode according to an exemplary embodiment of the present invention.

As shown in FIG. 3A, a polymer resin 162 is spread on the entire surface of a lower substrate 182 by a coating method such as spin coating or nozzle coating. For example, a hydrophilic polymer resin which dissolves in water can be used as the polymer resin 162.

Figure 3B:
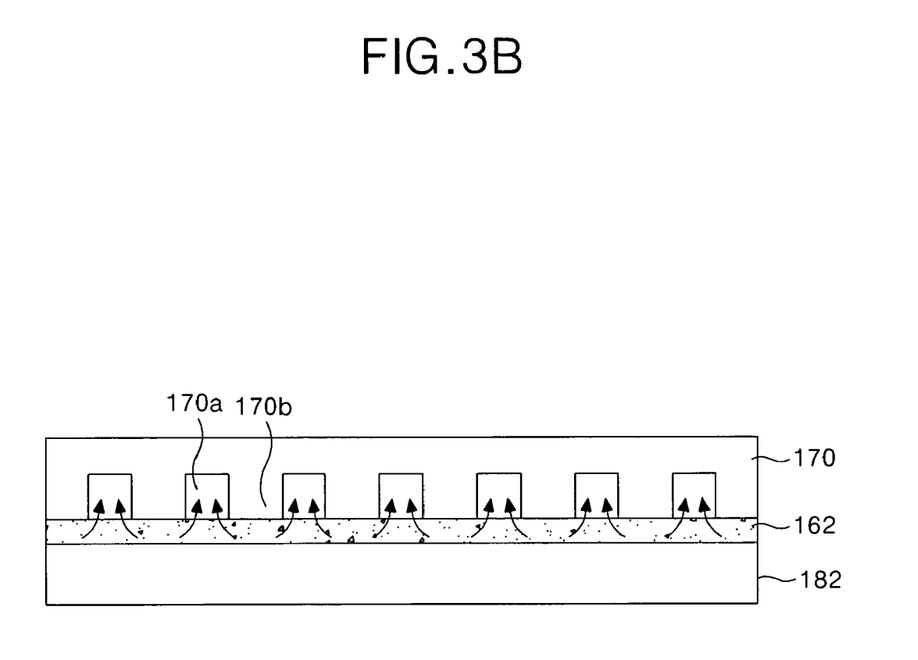

As shown in FIG. 3B, a soft mold 170 which has projections 170b and grooves 170a is placed on the polymer resin 162. The projections 170b are aligned with areas of the lower substrate 182 where gate electrodes are to be formed, and the grooves 170a are positioned to correspond to the other areas of the lower substrate 182. Here, the soft mold 170 may be a soft mold disclosed in the Korean Patent Application No. 2003-0098122, which is hereby incorporated herein by reference. The soft mold 170 may be made of a rubber material which has high elasticity, such as polydimethylsiloxane PDMS, polyurethane, or cross-linked novolac resin.

Figure 3C:
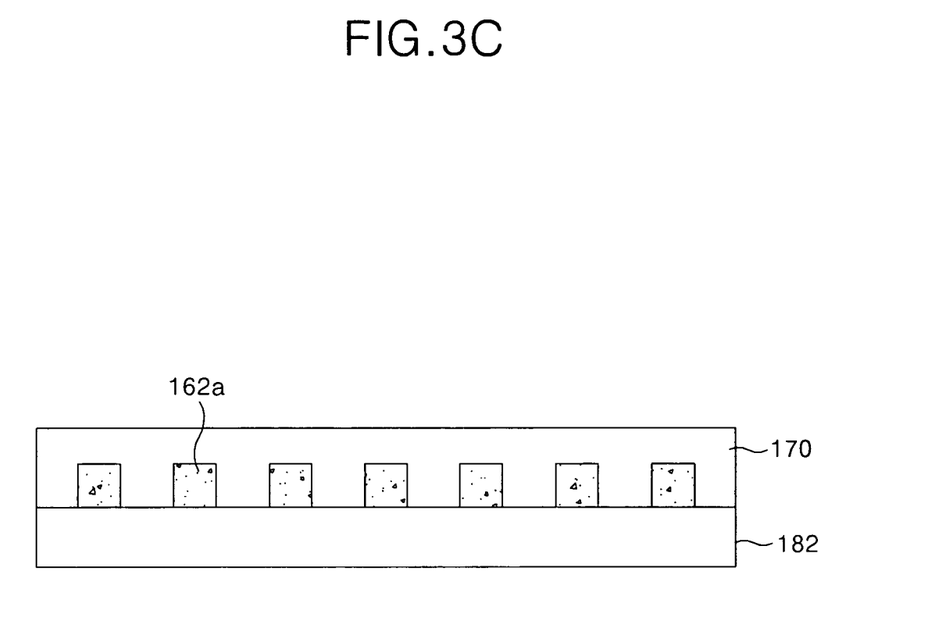

The surface of the projections 170b of the soft mold 170 is placed in contact with the polymer resin 162. The weight of the soft mold 170 applies pressure on the portions of the polymer resin 162 that contact the projections 170b, and after a given amount of time, e.g., 30 seconds to 10 minutes, the projections 170b come in contact with the lower substrate 182. Further, at the same time, the polymer resin 162 is soft-hardened by ultraviolet ray UV or the substrate 182 is baked at a temperature of about 130° C. or below. Then, a capillary force generated by a pressure between the soft mold 170 and the lower substrate 182 and a repulsive force between the soft mold 170 and the polymer resin 162 cause the polymer resin 162 to move into the grooves 170a of the soft mold 170. As a result, as shown in FIG. 3C, polymer resin patterns 162a are formed in areas corresponding to the grooves 170a of the soft mold 170.

Figure 3D:
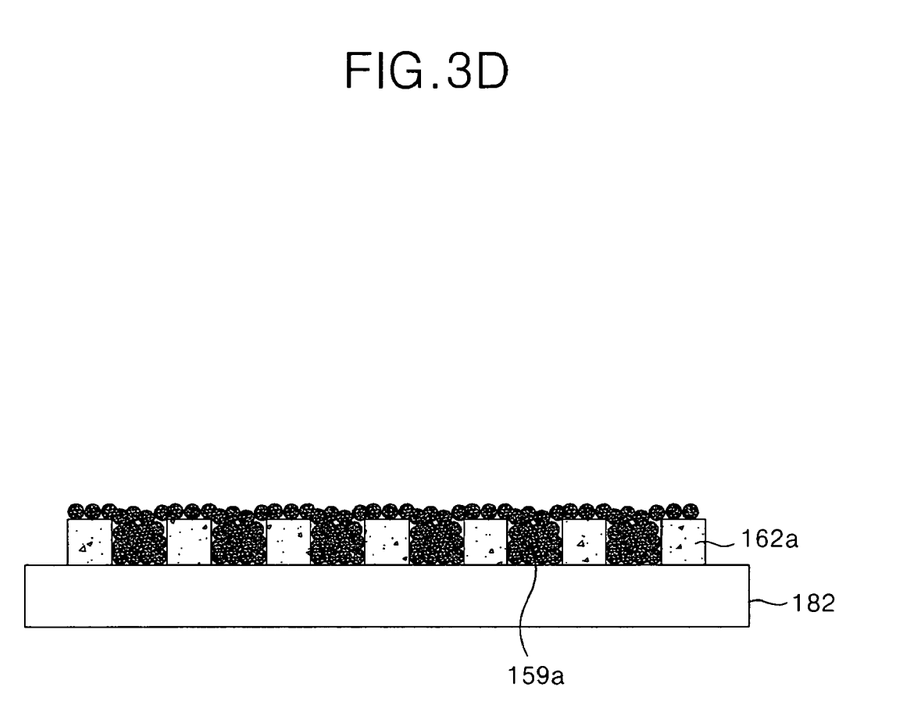

Then, the soft mold 170 is removed, and a nano powder gate electrode material 159a is spread over the lower substrate 182 where the polymer resin patterns 162a are formed, as shown in FIG. 3D. The nano powder gate electrode material is prepared by dissolving base materials such as Al, Cu, Cr, Mo, Al/Nd or any of their alloys in a hydrophobic solvent, thereby decomposing the base materials into nano sized powder. The hydrophobic solvent may include hexane and toluene. Then, the nano powder gate electrode material 159a is spread over the lower substrate 182 between the polymer resin patterns 162a, i.e., in the areas corresponding to the projections 170b of the soft mold 170 or in the areas where the gate electrodes are to be formed on the lower substrate 182.

Figure 3E:
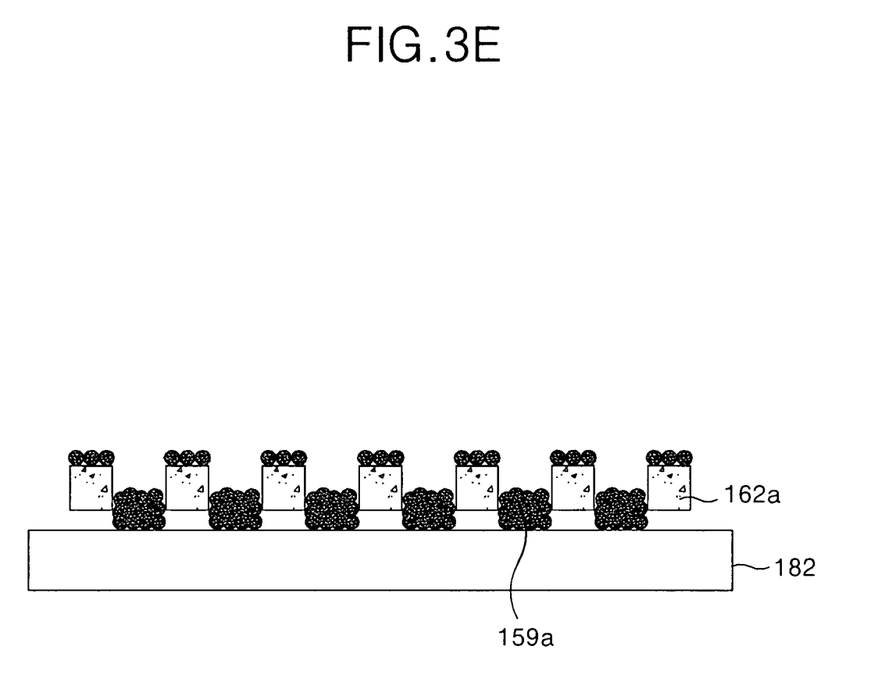
Figure 3F:
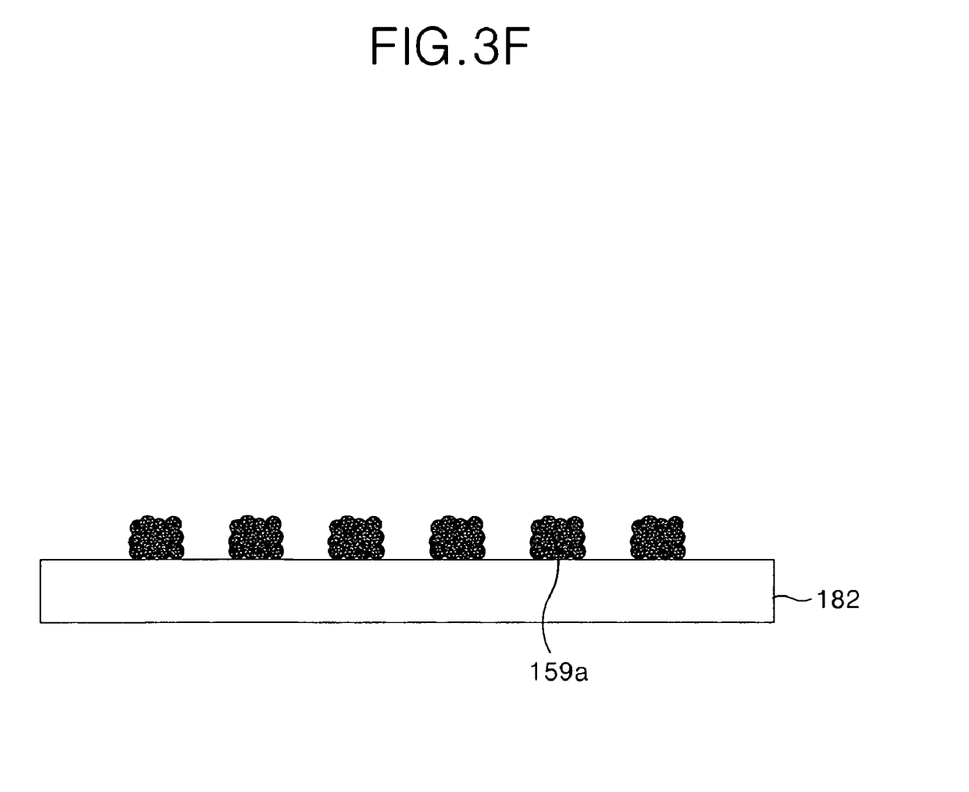

As shown in FIG. 3E, $H_2O$ is applied over the lower substrate 182 where the hydrophilic polymer resin patterns 162a and the nano powder gate electrode material 159a are formed to remove the hydrophilic polymer resin patterns 162a by dissolving it in $H_2O$. The nano powder gate electrode material 159a previously dissolved in the hydrophobic solvent does not dissolve in $H_2O$. Thus, only the hydrophilic polymer resin patterns 162a are removed, and the nano powder gate electrode material 159a remains on the lower substrate 182, as shown in FIG. 3F.

Figure 3G:
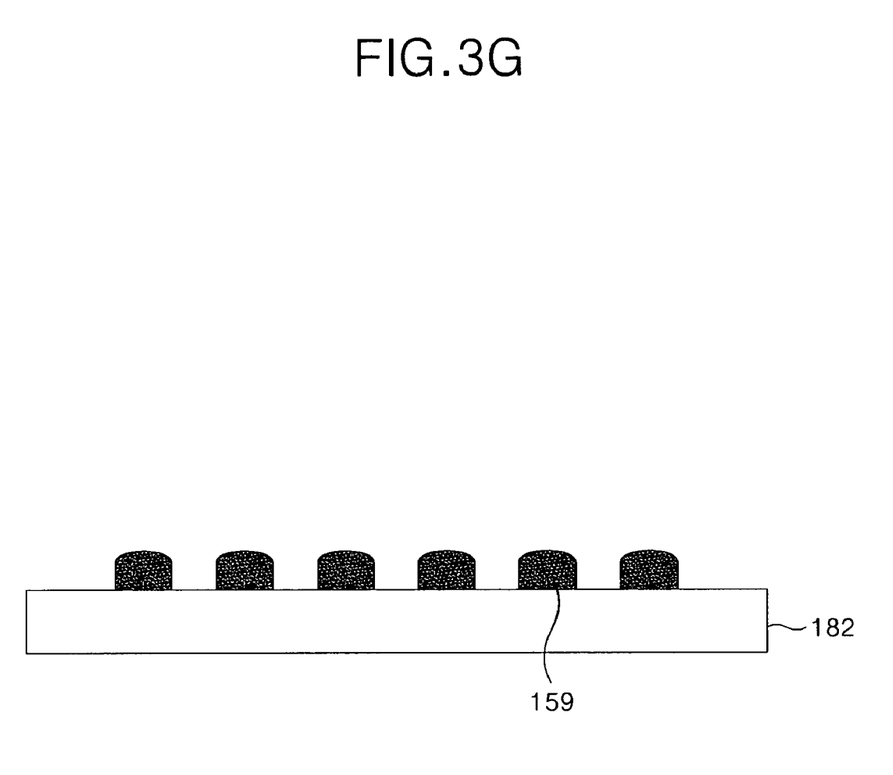

Then, the nano powder gate electrode material 159a is heat-treated by a firing process to form a current path between the nano powder gate electrode material 159a, thereby forming the gate electrodes 159, as shown in FIG. 3G.

With the use of the soft mold 170, the hydrophilic polymer resin -162 which dissolves in the hydrophilic solvent, and the nano powder gate electrode material 159a which is dissolved in the hydrophobic solvent, thin film patterns can be formed without performing such processes as the exposure and development process and the etching process which are required in the related art photolithography process to form thin film patterns. Accordingly, a fabricating process of the flat panel display device can be simplified, and the waste of photo-resist and developing solution for developing photo-resist patterns can be reduced. In addition, the expensive exposure equipment is not required. As a result, the manufacturing cost of the liquid crystal display panel can be reduced.

Here, although the use of a soft mold to form the hydrophilic polymer resin patterns is described in detail above in the exemplary embodiment, the hydrophilic polymer resin patterns can also be formed using a hard mold. The hard mold can be made of, for example, silicon or quartz. If the hard mold is used, the hydrophilic polymer resin is patterned in a state that the solvent component of the hydrophilic polymer resin which is spread over the substrate is volatized, i.e., in the state that the hydrophilic polymer resin is imprinted. Then, the hydrophilic polymer resin is patterned by the pressure applied from the outside and the high temperature heat. In contrast, when the soft mold is used as discussed in detail above, the soft mold patterns the hydrophilic polymer resin by applying pressure with its own weight to cause the surface of the projections of the soft mold to contact the substrate.

Also, in the above exemplary embodiment, a process of forming a gate pattern is described in detail. However, a similar process can be used to form other thin film patterns in a liquid crystal display device.

As described above, the fabricating method of the flat panel display device according to the exemplary embodiment of the present invention patterns the thin film patterns using the soft or hard mold, the hydrophilic polymer resin which dissolves in the hydrophilic solvent, and the nano powder gate electrode material which is dissolved in the hydrophobic solvent. With this method, the exposure, development, and the etching processes, which are required to pattern the thin film patterns using the related art photolithography process, can be omitted. Accordingly, the fabricating process of the flat panel display device can be simplified, and the waste of photo-resist and the developing solution for developing the photo-resist pattern can be reduced. In addition, the expensive exposure equipment is not required. As a result, the manufacturing cost of the liquid crystal display panel can be reduced.

It will be apparent to those skilled in the art that various modifications and variations can be made in the fabricating method for a flat panel display device of the present invention without departing from the sprit or scope of the invention. Thus, it is intended that the present invention covers the modifications and variations of this invention provided they come within the scope of the appended claims and their equivalents.

What is claimed is:

1. A fabricating method for a flat panel display device having a thin film pattern over a substrate, the method comprising the steps of:
    depositing a hydrophilic resin over a substrate;
    patterning the hydrophilic resin to form hydrophilic resin patterns over areas outside where thin film patterns are to be formed over the substrate;
    depositing a hydrophobic nano powder thin film material over the substrate and between the hydrophilic resin patterns;
    removing the hydrophilic resin patterns to form hydrophobic nano powder thin film patterns over the substrate; and
    treating the hydrophobic nano powder thin film patterns to form the thin film pattern.

2. The fabricating method according to claim 1, wherein the step of patterning the hydrophilic resin includes the steps of:
    placing a soft mold on the hydrophilic resin, the soft mold having projections aligned with areas where the thin film pattern is to be formed;
    applying pressure on areas of the hydrophilic resin under the projections of the soft mold to make the projections of the soft mold to come in contact with a layer underlying the hydrophilic resin; and
    removing the soft mold.

3. The fabricating method according to claim 2, wherein the layer underlying the hydrophilic resin is the substrate.

4. The fabricating method according to claim 2, wherein the step of applying pressure includes the step of leaving the soft mold on the hydrophilic resin for a predetermined amount of time, wherein the weight of the soft mold applies the pressure on the hydrophilic resin.

5. The fabricating method according to claim 2, wherein the soft mold includes a rubber material having a high elasticity.

6. The fabricating method according to claim 5, wherein the rubber material includes one of polydimethylsiloxane PDMS, polyurethane, and cross-linked novolac resin.

7. The fabricating method according to claim 1, wherein the step of patterning the hydrophilic resin includes the steps of:
    placing a hard mold on the hydrophilic resin, the hard mold having projections aligned with areas where the thin film pattern is to be formed;
    applying pressure on areas of the hydrophilic resin under the projections of the hard mold to make the projections of the hard mold to come in contact with a layer underlying the hydrophilic resin; and
    removing the hard mold.

8. The fabricating method according to claim 7, wherein the layer underlying the hydrophilic resin is the substrate.

9. The fabricating method according to claim 7, wherein the step of applying pressure includes the step of applying high temperature heat.

10. The fabricating method according to claim 7, wherein the hard mold includes one of silicon and quarz.

11. The fabricating method according to claim 1, wherein the step of removing the hydrophilic resin patterns includes the step of applying $H_2O$ over the substrate, the hydrophilic resin patterns, and the hydrophobic nano powder thin film patterns.

12. The fabricating method according to claim 1, wherein the hydrophobic nano powder thin film material is prepared by dissolving a thin film material in a hydrophobic solvent into a nano sized powder.

13. The fabricating method according to claim 12, wherein the thin film material includes at least one of Al, Cu, Cr, Mo, and Nd.

14. The fabricating method according to claim 12, wherein the hydrophobic solvent includes hexane and toluene.

15. The fabricating method according to claim 1, wherein the hydrophilic resin includes a polymer resin.

16. The fabricating method according to claim 1, wherein the step of treating includes firing the hydrophobic nano powder thin film patterns to form the thin film pattern.

* * * * *